Oct. 17, 1967 A. J. GRUODIS ETAL 3,348,033

SWITCHING CIRCUITS EMPLOYING ESAKI DIODES

Original Filed April 17, 1961

INVENTORS
ALGIRDAS J. GRUODIS
LAWRENCE K. LANGE
WILLIAM H. McANNEY

BY J. Tomcin Jr.
ATTORNEY

United States Patent Office 3,348,033
Patented Oct. 17, 1967

3,348,033
SWITCHING CIRCUITS EMPLOYING ESAKI DIODES

Algirdas J. Gruodis, East Haven, Conn., and Lawrence K. Lange, Wappingers Falls, and William H. McAnney, Poughkeepsie, N.Y., assignors to International Business Machines Corporation, Armonk, N.Y., a corporation of New York Original application Apr. 17, 1961, Ser. No. 103,374, now Patent No. 3,230,387, dated Jan. 18, 1966. Divided and this application Aug. 10, 1965, Ser. No. 478,585
3 Claims. (Cl. 235—175)

ABSTRACT OF THE DISCLOSURE

A switching circuit including a signal source capable of supplying signals of three levels of magnitude, a transistor amplifier having a base terminal, and a negative resistance diode having a high conductivity state for a low applied voltage and a low conductivity state for a high applied voltage connected between said base terminal and said signal source, whereby signals of said first magnitude switch said diode to its high conductivity state and activate said amplifier, signals of said second magnitude switch said negative resistance diode to said low conductivity state and said amplifier is not activated, and signals of said third magnitude force enough current through said diode in said low conductivity state to activate said amplifier.

This application is a division of an application of Algirdas J. Gruodis, Lawrence K. Lange, and William H. McAnney, Ser. No. 103,374, filed Apr. 17, 1961, now Patent No. 3,230,387, and entitled, "Switching Circuits Employing Esaki Diodes."

This invention relates to digital computing circuits and more particularly to such circuits employing Esaki diodes.

It is well known that circuits for performing logical operations in digital computers become more expensive as the logical operation to be performed becomes more complex. A greater number of switching elements are required to perform the logic. Also, where more than one input signal is to be acted upon by the circuit a greater number of switching elements are required in order to accept these additional input signals. Using the technique taught in the present invention the number of switching elements required to perform a given logical operation is reduced. Also, the present invention is capable of accepting a plurality of input signals without the use of additional switching elements, thereby reducing the expense of the circuit.

Circuits which require a large number of switching elements usually perform the logical operations slowly. Frequently the input signal must travel through many stages of switching elements before reaching the output. Each stage inserts a delay since the operation of one stage cannnot begin until the elements in the previous stage have completed switching. In the present invention the number of stages required for a given operation is reduced.

Accordingly it is an object of the present invention to provide switching circuits capable of performing logical operations using relatively few switching elements.

It is another object of the present invention to provide switching circuits with relatively few stages of delay.

In accordance with the foregoing objects, the invention utilizes the unique characteristics of the Esaki diode.

The Esaki diode has a high state of conduction and a low state of conduction as opposed to conventional switching elements, such as transistors, which have only a single state of conduction. In the present invention the Esaki diode controls the current supplied to conventional switching elements. Due to the Esaki diode's bistable characteristic more complicated logical operations can be performed with a given number of switching elements than could be performed using only conventional switching elements.

Further, the conduction in the Esaki diode depends upon the degree of signal amplitude applied thereto, as opposed to the conduction in conventional switching elements which depends merely upon the presence or absence of a signal. In the present invention a plurality of signals are combined using inexpensive passive networks to form a single signal whose amplitude is representative of the number of signals so combined. An advantageous feature of the present invention is the ability of the Esaki diode to switch conductivity states dependent upon the amplitude of the combined signals applied hereto, and to control conventional switching elements. Therefore, conventional switching elements may be replaced by relatively low cost passive networks resulting in a saving in expense and a saving in time since passive elements insert no switching time delay into the circuit.

The foregoing and other objects, features and advantages of the invention will be apparent from the following more particular description of preferred embodiments of the invention, as illustrated in the accompanying drawings.

Figure 1:
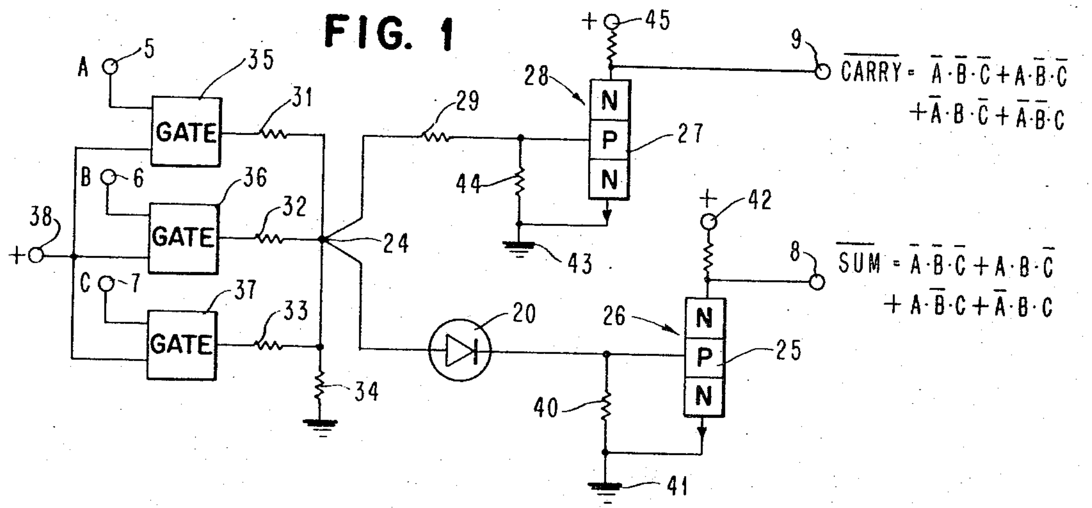
FIG. 1 is an electrical schematic of a full adder embodying the present invention.

Shown in FIG. 1 is a full adder circuit for adding the input signals A–C applied to terminals 5–7 and providing the inverted SUM output signal on terminal 8 and the inverted CARRY output signal on terminal 9. The input signals A and B represent the two binary digits to be added. The input signal C represents the carry from the next lower order bit position.

Figure 4:
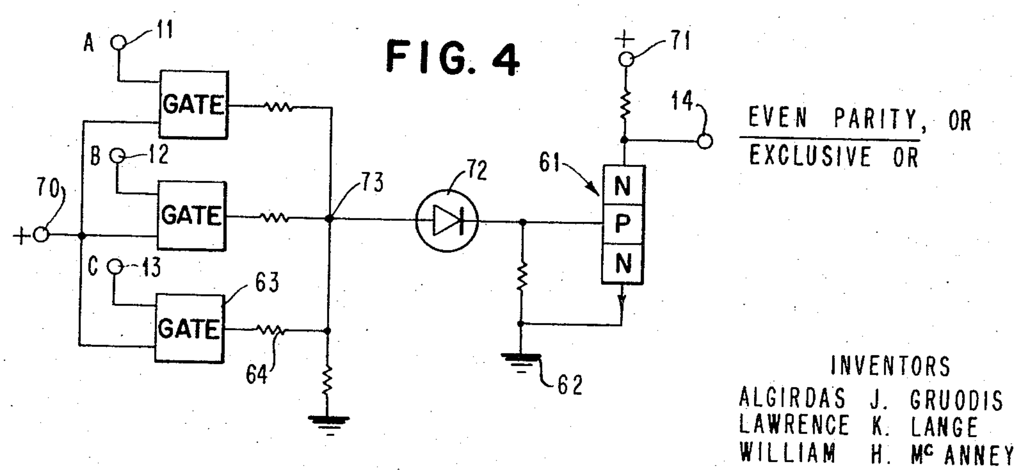
FIG. 4 is an electrical schematic of a parity checker, or Exclusive OR circuit embodying the present invention.

The circuit in FIG. 4 may be used as either a parity checker or an Exclusive OR circuit in a digital computer. The circuit of FIG. 4 is capable of accepting up to three signals on terminals 11–13 and providing a signal on terminal 14 which is identical to the signal provided on terminal 8 in FIG. 1. The signal on terminal 14 is useful because it performs a parity check upon the signals applied to the terminals 11–13 and is also representative of the Exclusive OR function of these signals as will be described in detail below.

Referring to FIG. 1, the Esaki diode 20 is a preferred negative resistance circuit elements to be used in the present invention. The diode is described in an article entitled "New Phenomenon in Narrow Germanium PN Junctions," Physical Review, vol. 109, 1958, pages 603 and 604, by L. Esaki. Although the Esaki diode, also called the Tunnel diode, is preferred, it should be understood that there are other negative resistance circuit elements which could be employed in the present invention with satisfactory results. The remaining paragraphs of the description, however, will be limited to switching circuits employing Esaki diodes for convenience in explanation.

Figure 2:
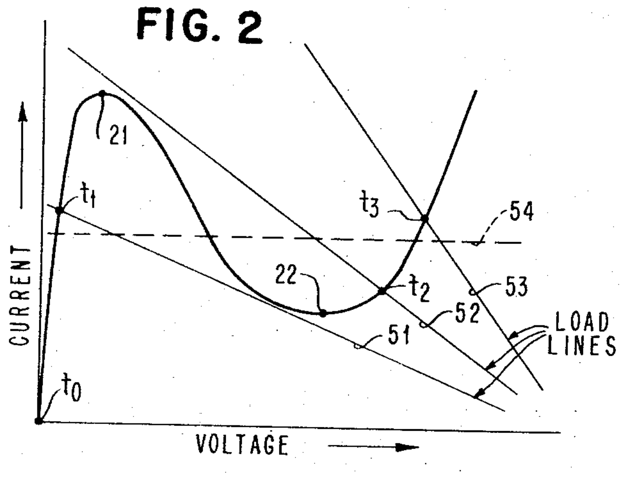
FIG. 2 is a current-voltage characteristic of an Esaki diode.

The current voltage characteristic for an Esaki diode is shown in FIG. 2. The operation of an Esaki diode is unique, in that as the voltage across the diode is increased the current increases rapidly until a peak value represented by the point 21 is reached. This region of the curve is called the high conductivity state. As the voltage across the diode increases past the point 21, the current decreases until the point 22 is reached. This region is known as the negative resistance region of the diode. Further increase in the voltage across the diode past the point 22 causes the current to begin increasing again. This last-mentioned region is called the low conductivity state.

The Esaki diode 20 is connected between a junction 24 and base 25 of transistor 26. Base 27 of transistor 28 is coupled to junction 24 by resistor 29. Resistors 31–34 form a network for coupling the outputs of gates 35–37 to the junction 24. The gates 35–37 apply the positive voltage supply on terminal 38 to the network 31–34 when a signal is applied upon terminals 5–7. For example when the signal A is present on terminal 5, the gate 35 is activated and the voltage on terminal 38 is applied to the resistor 31.

Figure 3:
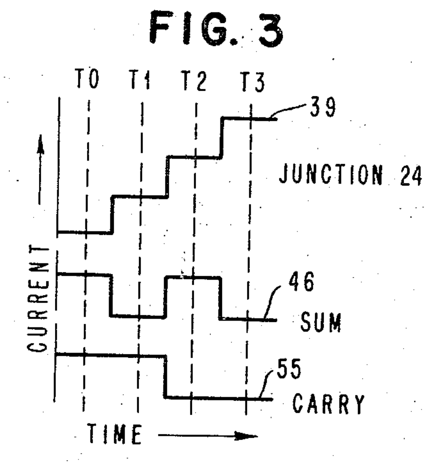
FIG. 3 is a diagram of input and output pulses for the electrical schematic shown in FIG. 1.

The current supplied to junction 24 by the network 31–34 is represented by the waveform 39 in FIG. 3. At time T0 none of the signals A–C are present on terminals 5–7. At time T1 one of the three signals is present; at time T2 two of the three signals are present; and at time T3 all of the signals are present. The waveform 39 increases in magnitude for each additional input signal applied.

Operation of Esaki diode 20 and transistors 26 and 28 may be described with reference to the current-voltage characteristic shown in FIG. 2. At time T0 the current flowing through Esaki diode 20 is zero so that transistor 26 is not conducting. The resistor 40 connects the base 25 to ground 41. At this time the voltage on terminal 8 approaches the voltage of the positive supply on terminal 42. The output on terminal 8 is represented by the waveform 46. The current into junction 24 is zero at time T0 and therefore no current is coupled through resistor 29 to the base 27. Transistor 28 is not conducting at this time since the base 27 is connected to ground 43 by resistor 44. The voltage on output terminal 9 approaches the voltage of the positive supply on terminal 45 represented by the waveform 55 at time T0.

The load lines 51–53 are determined by the power supply on terminal 38, and the resistors 29, 31–34, 40 and 44. At time T1 the current through the Esaki diode 20 is represented by the point $t_1$ in FIG. 2. This magnitude of current exceeds that which is sufficient to cause the transistor 26 to conduct. The magnitude of current sufficient to cause the transistor 26 to conduct can be adjusted by resistor 40 and is represented by the dashed line 54 in FIG. 2. At time T1 the output on terminal 8 approaches the ground potential 41 represented by the waveform 46 at time T1. At this time most of the current from junction 24 is conducted through the Esaki diode 20. There is insufficient current coupled to the base 27 to cause the transistor 28 to conduct. Therefore, the waveform 55 shows the output signal on terminal 9 at the level approaching the positive supply connected to terminal 45.

At time T2 the Esaki diode is switched to the low conductivity state. The current passing through the diode is represented by the point $t_2$. At this time the current through the Esaki diode 20 is below the magnitude represented by the line 54 and therefore is insufficient to cause transistor 26 to conduct. The output on terminal 8 rises as shown in FIG. 3 by the waveform 46 at time T2. The current flowing out of the junction 24 now takes the path through resistor 29 to the base 27 because the high impedance of the Esaki diode 20 now in the low conductivity state blocks the current. The resistor 44 can be adjusted so that this amount of current is sufficient to cause transistor 28 to conduct. Therefore, at time T2 as represented by the waveform 55, the voltage on terminal 9 approaches the level of ground 43.

The point $t_3$ in FIG. 2 represents the current flowing through the Esaki diode at time T3. This current exceeds the magnitude represented by the line 54 and is sufficient to cause the transistor 26 to conduct. Since the Esaki diode is in the low conductivity state a portion of the current flowing into the junction 24 takes the path through the resistor 29 to the base 27 and is sufficient to cause transistor 28 to conduct.

The outputs generated on the terminals 8 and 9, as described above, represent the inverted sum and carry functions respectively. This can be shown by writing the Boolean algebra expression for the signals generated on the terminals 8 and 9. Boolean algebra is described in the text Arithmetic Operations in Digital Computers by R. K. Richards, Van Nostrand Company, Inc. The expression at the terminal 8 is an algebraic statement of when the voltage on this terminal approaches the voltage of the positive supply on terminal 42 as a function of the presence and absence of the signals A–C on terminals 5–7. The first term of the expression, $\overline{A}\cdot\overline{B}\cdot\overline{C}$, represents the condition at the time T0. That is, when all of the signals A–C are absent the more positive signal is present on output terminal 8. The next three terms of the Boolean expression $A\cdot B\cdot\overline{C}+A\cdot\overline{B}\cdot C+\overline{A}\cdot B\cdot C$ represent the three possible variations of the input signals which result in the operation described at time T2. That is, when any two of the signals A–C are present, terminal 8 is positive. The entire expression $\overline{A}\cdot\overline{B}\cdot\overline{C}+A\cdot B\cdot\overline{C}+\overline{A}\cdot B\cdot C+A\cdot B\cdot C$ can be rewritten as $A\cdot B\cdot C+\overline{A}\cdot\overline{B}\cdot C+\overline{A}\cdot B\cdot\overline{C}+A\cdot\overline{B}\cdot\overline{C}$ which is the familiar expression of the SUM function inverted.

In a like manner the Boolean expression at the output terminal 9 can be rewritten as $$A\cdot B\cdot C+\overline{A}\cdot B\cdot C+A\cdot\overline{B}\cdot C+A\cdot B\cdot\overline{C}$$

which is the familiar CARRY function inverted.

The circuit of FIG. 4 is identical to that shown in FIG. 1 with the exception of transistor 28 and coupling resistor 29 which have been removed. The operation of the circuit is the same, and the Boolean expression for the output on terminal 14 is identical to that shown at terminal 8. This output signal is useful because it performs a parity check upon the input signals A–C. That is, the signal is present on terminal 14 when the number of inputs present on terminals 11–13 is even. For example, when there are no inputs on terminals 11–13 the output is present on terminal 14 indicating an even parity (zero) of inputs. When any two of the inputs are present on terminals 11–13 the signal on terminal 14 is present indicating that there is an even parity (two) of inputs. However, when all three inputs are present the transistor 61 conducts and the output signal on terminal 14 approaches the lower potential of ground 62. Likewise when any one of the three input signals A–C is present the transistor 61 conducts and the signal on output terminal 14 is absent indicating that an odd parity exists.

A two-way Exclusive OR circuit can be made by eliminating the terminal 13, gate 63, and resistor 64 from the circuit shown in FIG. 4. The three possible operating conditions of this circuit are represented by the times T0, T1, and T2 in FIGS. 2 and 3. The Boolean expression at the output terminal 14 as a function of the signals A and B is $\overline{A\cdot B}+A\cdot B$. When this expression is inverted, it becomes $\overline{A\cdot\overline{B}+\overline{A}\cdot B}$ which is recognized to be the Exclusive OR function inverted.

With reference to FIG. 1 the gates 35–37 and resistor network 31–34 can be replaced with any suitable signal converting means which can generate an analog representation of the signals A–C. Another suitable signal source is a potentiometer with a slideable wiper arm. The waveform generated by this type of signal source would be linearly increasing waveform as opposed to the stepwise waveform 39. However, at times T0–T3 the operation of the circuit would be identical to that described in response to the stepwise waveform 40.

In the embodiments of the invention shown in FIGS. 1 and 4 NPN junction type transistors are shown. PNP type transistors can be used by reversing the polarity of the voltage supplies on terminals 38, 42, 45, 70 and 71 and by reversing the Esaki diodes 20 and 72 so that the direction of the current flow is into the junctions 24 and 73 respectively. The waveforms 39, 46 and 55, shown in FIG. 3, are inverted for the PNP embodiment of the full adder shown in FIG. 1. This results in the true form of the SUM and CARRY function generated at the terminals 8 and 9. Likewise, the true form of the Exclusive OR function is generated on terminal 14 when the circuit of FIG. 4 is implemented with the PNP type transistor. When the circuit of FIG. 4 is used as a parity checker, the signal on terminal 14 approaches the more positive level of ground 62 when the parity of the input signals A–C is odd.

From the above detailed description it can be seen that relatively few switching elements have been used. The outputs from gates 35–37 are converted into a single analog representation by the resistor network 31–34 without the use of switching elements and without inserting a switching delay. This analog signal differs from the conventional binary signal in that the magnitude of the analog signal carries information. The ability of the switching circuits of the present invention to respond to the magnitude of analog signals brings about the reduction in the number of switching elements and the reduction in time delays.

While the invention has been particularly shown and described with reference to prefered embodiments thereof, it will be understood by those skilled in the art that the foregoing and other changes in form and details may be made therein without departing from the spirit and scope of the invention.

We claim:

1. A switching circuit comprising: a transistor amplifier including a base terminal; a signal source capable of supplying signals of a first, a second, and a third increasing degree of magnitude; a negative resistance diode having a high conductivity state for a low applied voltage and a low conductivity state for a high applied voltage connected between said base terminal and said signal source, whereby signals of said first magnitude switch said negative resistance diode to said high conductivity state and are sufficient to cause said transistor to conduct, sginals of said second magnitude switch said negative resistance diode to said low conductivity state and are insufficient to cause said transistor to conduct, and signals of said third magnitude switch said negative resistance diode to said low conductivity state and are sufficient to force enough current through said diode in said low conductivity state to cause said transistor to conduct.

2. A parity checker circuit for checking the parity of three signals comprising: a transistor amplifier including a base terminal; converting means for accepting said three signals and providing an analog representation thereof; a negative resistance diode having a high conductivity state for a low applied voltage and a low conductivity state for a higher applied voltage connected between said base terminal and said converting means, whereby the presence of one of said signals switches said negative resistance diode to said high conductivity state and is sufficient to cause said transistor to conduct, the presence of any two of said signals switches said negative resistance diode to said low conductivity state and is insufficient to cause said transistor to conduct, and the presence of all three of said signals switches said negative resistance diode to said low conductivity state and is sufficient to force enough current through said diode in said low conductivity state to cause said transistor to conduct.

3. A full adder circuit for accepting three signals and providing a SUM and a CARRY output comprising: a first, and a second transistor amplifier, each having a base terminal; converting means for accepting said three signals and providing at its output terminal an analog representation thereof; a negative ressitance diode having a high conductivity state for a low applied voltage and a low conductivity state for a higher applied voltage connected between the base terminal of said first transistor and said output terminal; a coupling network connected between the base terminal of said second transistor and said output terminal, whereby the presence of one of said signals switches said negative resistance diode to said high conductivity state and is sufficient to cause said first transistor to conduct, the presence of any two of said signals switches said negative resistance diode to said low conductivity state causing said first transistor to conduct and diverting enough current through said coupling network to cause said second transistor to conduct, and the presence of all three of said signals switches said negative resistance diode to said low conductivity state and is sufficient to force enough current through said diode in said low conductivity state to cause said first transistor to conduct.

References Cited

UNITED STATES PATENTS

| | | | |
|---|---|---|---|
| 3,194,974 | 7/1965 | Rymaszeski | 307—88.5 |
| 3,218,483 | 11/1965 | Clapper | 307—88.5 |

MALCOLM A. MORRISON, *Primary Examiner*.

V. SIBER, *Assistant Examiner*.